United States Patent
Anderson et al.

(10) Patent No.: US 6,841,263 B2
(45) Date of Patent: Jan. 11, 2005

(54) METHOD OF ADHERING A SOLID POLYMER TO A SUBSTRATE AND RESULTING ARTICLE

(75) Inventors: Charles W. Anderson, Pasadena, MD (US); William F. Czages, Burlington, NC (US)

(73) Assignee: The John Hopkins University, Baltimore, MD (US)

( * ) Notice: Subject to any disclaimer, the term of this patent is extended or adjusted under 35 U.S.C. 154(b) by 0 days.

(21) Appl. No.: 10/428,378

(22) Filed: May 2, 2003

(65) Prior Publication Data

US 2003/0207145 A1 Nov. 6, 2003

Related U.S. Application Data

(60) Provisional application No. 60/377,962, filed on May 3, 2002.

(51) Int. Cl.[7] ................... B32B 15/00; B32B 15/04; B32B 19/00
(52) U.S. Cl. ................ 428/640; 428/651; 428/458; 428/468; 428/469; 428/697; 428/702
(58) Field of Search ................ 428/457, 458, 428/459, 460, 461, 469, 702, 639, 690, 651, 472, 468, 697

(56) References Cited

U.S. PATENT DOCUMENTS

| | | | | |
|---|---|---|---|---|
| 2,551,591 A | * | 5/1951 | Foord | 428/469 |
| 2,750,832 A | * | 6/1956 | Morgan | 359/585 |
| 4,239,827 A | * | 12/1980 | Notaro | 428/34.5 |
| 4,410,927 A | * | 10/1983 | Butt | 361/720 |
| 4,528,064 A | * | 7/1985 | Ohsawa et al. | 216/18 |
| 4,549,950 A | * | 10/1985 | Polan et al. | 204/206 |
| 4,569,902 A | * | 2/1986 | Saito | 430/313 |
| 4,859,281 A | | 8/1989 | Goltz | 156/666 |
| 5,795,626 A | | 8/1998 | Gabel et al. | 427/458 |
| 6,074,135 A | | 6/2000 | Tapphorn et al. | 406/46 |
| 6,193,835 B1 | * | 2/2001 | Yoshikawa et al. | 156/281 |

OTHER PUBLICATIONS

Merriam Websters Collegiate Dictionary, tenth edition; pp146, Merriam–Webster, Spingfield Mass. 1997.*

* cited by examiner

*Primary Examiner*—D. S. Nakarani
*Assistant Examiner*—Kevin R. Kruer
(74) *Attorney, Agent, or Firm*—Albert J. Fasulo, II

(57) ABSTRACT

An improved method for adhering a solid polymer component to a substrate is provided. An intermediate polymer adhesion promoting coating of metal oxide is applied to the substrate which enhances the adhesion of the subsequently applied solid polymer component to the substrate.

8 Claims, No Drawings

METHOD OF ADHERING A SOLID POLYMER TO A SUBSTRATE AND RESULTING ARTICLE

CROSS REFERENCE TO RELATED APPLICATIONS

This application claims the benefit of U.S. Provisional Application No. 60/377,962, filed May 3, 2002, the contents of which are incorporated by reference herein.

BACKGROUND OF THE INVENTION

1. Field of the Invention

The present invention generally relates to adhering solid polymeric materials to substrates. More particularly, the present invention relates to an improvement in the surface treatment of a substrate, e.g., one of metal, plastic or ceramic, whereby solid polymeric materials, e.g., polyethylene, are made to adhere more tenaciously to the surface of the substrate.

2. Description of the Related Art

Methods for the application of solid polymers to the surface(s) of the many kinds of substrates, especially those of metal, are well known. Techniques for adherently applying a solid polymer to a substrate have found use in, for example, coating metal pipes and conduits, conductive wires, cables and other electrical components, to resist or retard corrosion. These coatings may also act as insulation and/or provide other useful properties, e.g., improved mechanical performance, durability, abrasion resistance, color coding, etc.

For example, polyethylene is commonly used for wire insulation including insulation of land, underground, and transoceanic cables, sealing electronics, electronic packages, chemical containers, barrels, tanks, bulk storage containers, intermediate bulk containers, double wall tanks, laboratory beakers, filters, and filtration system components, etc. Polyethylene has exceptional mechanical performance characteristics such as abrasion resistance and toughness and is also known for its high dielectric value and resistance to chemical attack. However, the inert chemical properties of polyethylene which make it so useful in many applications hamper its adherence to many kinds of substrates including a variety of metals and plastics that would benefit from a polyethylene coating.

Various methods for coating substrates are known. For example, U.S. Pat. Nos. 4,985,313 and 5,209,987 disclose electrical wires having both an electrically insulating refractory coating and a layer of solid polymer as insulation.

It is also known that copper oxide possesses the ability to improve the adhesion of coatings to a metal surface. For example, it is known in the semiconductor field that the adherence of copper metal of circuitry innerlayers and cured pre-preg layers or other nonconductive coatings may be improved by subjecting the copper to oxidation thus forming a layer of copper oxide (also known as black oxide). Compounds useful in this oxidization process include etchant compositions based on hydrogen peroxide. Such compositions and processes are disclosed, e.g., in U.S. Pat. No. 4,859,281. In U.S. Pat. No. 6,419,784, a predip solution applied to a copper substrate prior to oxidation of the surface of the copper for improved adhesion of a subsequently applied solid polymer coating thereto is said to improve the uniformity of the coating.

Among the methods for applying coatings to substrates is electro-chemical plating, a well known technique for depositing a metal coating on a surface. However, electroplating may not work in some instances where there is incompatibility between the substrate and the electroplating process which can result in the separation of the plating from the underlying material. In addition, plated surfaces typically possess a fairly smooth outer surface which is not ideal for adding additional layers and techniques for roughening an electroplated surface may remove too much plating leaving exposed substrate.

Other methods for applying coatings to substrates include thermal spraying, which generally involves heating particles to a molten or plastic state and propelling them onto a substrate to form a coating. Thermal spraying processes are used extensively in the semiconductor industry, to recondition worn or used parts and to prepare machine parts for extended wear in high friction and abrasive environments and high temperature applications. Both metal and plastic/polymeric coatings may be applied using these spraying techniques.

Yet another method for applying coatings is kinetic metallization as disclosed, e.g., in U.S. Pat. Nos. 5,795,626 and 6,074,135. This method is primarily used for applying a metal coating to a metal substrate without altering the metallurgical properties of either the coating or the substrate.

SUMMARY OF THE INVENTION

The present invention is directed to a method for enhancing the adherence of a solid polymer to a substrate which comprises:

a) providing a substrate;

b) applying at least one polymer adhesion promoting coating of a metal oxide selected from the group consisting of an oxide of copper and an oxide of a copper-containing alloy in adherent contact with at least a portion of a surface of the substrate; and, c) applying a solid polymer component in adherent contact with at least a portion of a surface of the polymer adhesion promoting coating of metal oxide.

In one embodiment of the present invention, the step of applying at least one polymer adhesion promoting coating of a metal oxide can be carried out by directly depositing a coating of a metal oxide upon the surface of the substrate. In another embodiment, the step of applying at least one polymer adhesion promoting coating of a metal oxide can be carried out by depositing a coating of at least one member of the group consisting of copper and copper-containing alloy upon the substrate and thereafter oxidizing the coating of metal and/or alloy to convert same to the corresponding oxide.

The solid polymer component imparts enhanced mechanical properties to the substrate including, but not limited to, abrasion resistance, toughness, insulating ability, corrosion resistance, color coding, etc. In accordance with the present invention, any substrate which can benefit from the application of a solid polymer thereto can advantageously employ the method of the present invention. For example, non-polyethylene polymer materials can be provided with a copper oxide coating and subsequently adherently joined to a polyethylene which, in the absence of the copper oxide coating, might not satisfactorily adhere to the non-polyethylene polymer substrate. Employing the method of the invention, polyethylene, which does not adhere well to many polymers used for electrical conductors, connectors, etc., will find use in such applications.

The present invention is also directed to the polymer-coated substrate resulting from the foregoing method. Thus, substrates such as ceramics and polymers can be coated in accordance with the methods of the present invention with enhanced adhesion of the solid polymer component. In addition, where the substrate is made of metal, the method of the present invention does not require that the metal from which the polymer adhesion promoting coating of metal oxide herein is derived be the same as the metal of the underlying substrate.

DESCRIPTION OF THE PREFERRED EMBODIMENTS

The present invention is directed to a method for improving the adherence of solid polymer components to a substrate by applying a polymer adhesion promoting coating of metal oxide to the substrate prior to applying the solid polymer component. The term "coating" as used herein refers to a separate material applied to a substrate resulting in a distinct metal oxide coating-substrate interface and is to be distinguished from the formation of a metal oxide layer on a metal surface by oxidation of the latter, such oxidation resulting in an oxide layer lacking a distinct interface with the underlying nonoxidized metal material.

The polymer adhesion promoting coating of metal oxide can be directly applied by depositing metal oxide on the surface of a substrate or it can be applied as a metal coating which is thereafter oxidized thus converting the metal coating to the metal oxide coating component of the present invention. The polymer adhesion promoting coating of metal oxide can also be applied as a mixed metal/metal oxide, which can also thereafter be oxidized to convert the metal in the coating to the corresponding metal oxide.

The solid polymer component that is subsequently applied to the polymer adhesion promoting coating of metal oxide herein exhibits excellent adhesion to the metal oxide coating and, as a result, improved adhesion to the underlying substrate. The substrate to be coated can be in any shape or form, i.e., containers, barrels, tanks, conduits, pipes, wires (including conductive wires), cables, etc. In addition, reinforcing bands, straps, and brackets for these shapes that adhere to the solid polymer component can be utilized as substrates in accordance with the present invention.

Substrates which can be coated with a polymer adhesion promoting coating of metal oxide in accordance with the method of the present invention include, but are not limited to, metals, plastics, glass, concrete, fiberglass, fiber-reinforced plastics, including carbon fiber-reinforced plastics, and ceramics. In one preferred embodiment, the substrate to be coated by the method of the present invention can be a metal such as, for example, aluminum, corrosion resistant steel, stainless steel, carbon steel, iron, magnesium, nickel, copper, copper alloy, tantalum, titanium, zinc, and the like. In another preferred embodiment, the substrate can be a solid polymer such as, for example, polyacetal, acrylonitrile-butadienestyrene polymer, polyacrylic, polyfluorocarbon, polyolefin, polyester, polyamide, polytetrafluoroethylene, silicone polymer, and the like. In yet another preferred embodiment, the substrate can be a ceramic.

Prior to application of the polymer adhesion promoting coating of metal oxide, the substrate surface is preferably cleaned. Methods for cleaning substrate surfaces are known in the art with the choice of a particular cleaning procedure depending upon the nature of the substrate. Suitable substrate surface cleaning techniques include washing, scraping, wire brushing, machining, grit blasting, chemical action with acid, alkaline, or salt, etc. Preferably, the metal oxide coating is applied as soon as practicable after completion of the cleaning operation in order to prevent or reduce the possibility of re-contamination of the substrate surface.

The polymer adhesion promoting coating of metal oxide applied to the substrate tenaciously adheres to the substrate and the subsequently applied solid polymer component tenaciously adheres to the metal oxide coating. In this way, the polymer adhesion promoting coating of metal oxide significantly improves the binding of the solid polymer component to the underlying substrate surface.

The polymer adhesion promoting coating of metal oxide herein is selected from the group consisting of an oxide of copper and an oxide of a copper-containing alloy. Suitable copper-containing alloys which can be utilized to provide the polymer adhesion promoting coating of metal oxide include, but are not limited to, alloys of copper with one or more member of, for example, arsenic, beryllium, cadmium, cobalt, chromium, iron, lead, nickel, phosphorus, silicon, silver, tellurium, tin, zinc and zirconium. Other copper-containing alloys include, but are not limited to, the aluminum bronzes, the silicon bronzes and the tin bronzes.

The polymer adhesion promoting coating of metal oxide can be applied by methods known to those skilled in the art. Representative of these techniques include, for example, thermal spray techniques, including flame spraying and high-velocity flame spraying, plasma spraying, kinetic metallization, plating techniques, and so forth.

Known thermal spraying processes may be classified into two groups, namely, chemical combustion spraying and electric heating spraying. Chemical combustion spraying includes powder flame spraying, wire/rod flame spraying, high velocity oxygen fuel flame spraying and detonation/explosive flame spraying. Electric heating spraying includes electric-arc or twin-wire arc spraying and plasma spraying. The two groups of spraying processes generally differ according to the methods used to provide the heat for plasticizing and/or atomizing the material which provides the metal oxide coating. In general, flame sprayed metal oxide coatings exhibit lower bond strengths, higher porosity, a narrower working temperature range and a higher heat transmittal to the substrate than electric-arc and plasma sprayed metal oxide coatings.

Flame spray guns for use in thermal spraying are well known in the art. These guns are widely used for the application of metallic, ceramic, metallic-ceramic coatings and plastics. Typical flame spray guns are, for example, described in U.S. Pat. Nos. 4,632,309 and 4,934,595, the contents of each of which are incorporated by reference herein. In these guns, a stream of particulate material entrained in pressurized conveying air, a stream of pressured combustion and propelling air, and a stream of fuel gas, are delivered in a concentric annular configuration to a combustion chamber such that the particulate material stream passes through a flame tunnel. Special considerations are given to increasing the diameter and length of the flame tunnel to maximize the rate at which the particulate material can be applied to the substrate surface.

Powder flame spraying involves the use of a powder flame spray gun consisting of a high-capacity, oxygen-fuel gas torch and a hopper containing the material which will form the metal oxide in powder or particulate form. A small amount of oxygen from the gas supply is diverted to carry the powdered material which will form the metal oxide coating by aspiration into the oxygen-fuel gas flame where the powder is heated and propelled by the exhaust flame onto the substrate. The fuel gas is usually acetylene or hydrogen and temperatures in the range of about 3,000° F. to 4,500° F. are typically obtained. Particle velocities are on the order of about 80 to about 100 feet per second. The resulting metal oxide coating generally has a low bond strength, high porosity and low overall cohesive strength.

Wire/rod flame spraying utilizes a wire of the material which will form the metal oxide coating. The wire is continuously fed into an oxy-acetylene flame where it is melted and atomized by an auxiliary stream of compressed air and then deposited as a coating of metal oxide on the surface of the substrate. This process also lends itself to use of plastic tubes filled with the material which will form the metal oxide coating in a powder form.

High velocity, oxygen fuel flame spraying is a continuous combustion process that produces exit gas velocities estimated to be about 4,000 to about 5,000 feet per second and particle speeds of about 1,800 to about 2,600 feet per second. This is accomplished by burning a fuel gas (usually propylene) with oxygen under high pressure (about 60 to about 90 psi) in an internal combustion chamber. Hot exhaust gases are discharged from the combustion chamber through exhaust ports and thereafter expanded in an extending nozzle. Powdered material which will form the metal oxide coating is fed axially into the extending nozzle and confined by the exhaust gas stream until the powdered material which will form the metal oxide coating exits in a thin high speed jet to produce coatings which are more dense than those produced by powder flame spraying.

One modification of a flame spraying process is referred to as a flame spray and fuse process. In this process, material which will form the metal oxide coating is applied to the substrate surface using one of the above described flame spraying processes followed by a fusing step. Fusing is accomplished by one of several techniques such as flame or torch, induction, or in vacuum, inert or hydrogen furnaces. Typical fusing temperatures are between 1,850° F. to 2,150° F. and therefore the substrate material must be able to withstand this temperature range.

In contrast to the previously described thermal spray processes, i.e., powder flame spraying, wire/rod flame spraying and high velocity, oxygen fuel flame spraying, which utilize the energy of a steadily burning flame, the detonation/explosive flame spraying process uses detonation waves from repeated explosions of oxy-acetylene gas mixtures to accelerate the powered material which forms the metal oxide coating. Particulate velocities on the order of 2,400 feet per second are achieved and the deposits of the material which make up the metal oxide coating are extremely strong, hard, dense and tightly bonded.

The electrical heating thermal spraying process, referred to as the twin-wire arc spraying process, uses two consumable wires of material which form the metal oxide coating. The wires are initially insulated from each other and simultaneously advanced to meet at a focal point in an atomizing gas stream. Contact tips serve to precisely guide the wires and to provide good electrical contact between the moving wires and power cables. Heating is provided by means of a direct current potential difference applied across the wires to form an arc that melts the intersecting wires. A jet of gas (normally compressed air) shears off molten droplets of the melted material which will form the metal oxide coating and propels this material onto the substrate. Sprayed particle sizes can be changed with different atomizing heads and wire intersection angles. Direct current is supplied at potentials of about 18 to about 40 volts, depending on the material which will form the metal oxide to be sprayed; the size of the particle spray increasing as the arc gap is lengthened with rise in voltage. Voltage is therefore maintained at a higher level consistent with arc stability to provide larger particles and a rough, porous metal oxide. Because high arc temperatures (in excess of about 7,240° F.) are typically encountered, twin-wire arc sprayed coatings have high bond and cohesive strength.

Plasma spraying involves the passage of a gas or a gas mixture through a direct current arc maintained in a chamber between a coaxially aligned cathode and water-cooled anode. The arc is initiated with a high frequency discharge that partially ionizes the gas to create a plasma having temperatures that may exceed 30,000° F. The plasma flux exits the gun through a hole in the anode which acts as a nozzle and the temperature of the expelled plasma effluent falls rapidly with distance. Powdered feed-stock is introduced into the hot gaseous effluent at an appropriate point and propelled to the workpiece by the high velocity stream. The heat content, temperature and velocity of the plasma gas are controlled by regulating arc current, gas flow rate, the type and mixture ratio of gases and by the anode/cathode configuration.

Plasma spraying can be optionally conducted in an inert atmosphere, e.g., Argon, or at high speed, and multiple metal oxides can be applied.

In all of the above thermal spraying techniques, oxidation of metal during the spray process takes place to provide the metal oxide coating component of the present invention. Alternatively, the metal oxide coating can be applied by spraying preformed metal oxide powder on the surface of the substrate. In other cases, it may be desirable to first apply a metal coating to the substrate and thereafter subject the metal coating to an oxidizing operation to convert surface metal to the corresponding oxide.

Other processes which can be used in accordance with the present invention include those disclosed in U.S. Pat. Nos. 5,795,626 and 6,074,135, the contents of which are incorporated by reference herein. These processes, sometimes referred to as kinetic metallization, can be used to apply metal coatings or metal oxide coatings to metal substrates. The processes are performed with a specially designed, converging-diverging deposition nozzle capable of accelerating and triboelectrically charging metal particles entrained in an inert carrier gas. Fluid, dynamically coupled debris recovery nozzles capture surface contaminants and accelerant gas for recycling and reuse.

In kinetic metallization, once accelerated to high speed and electrically charged, particles of metal or metal oxide are directed at high velocity to the surface of a substrate. Subsequent high-speed collision of the particles with the substrate causes a very large strain (approximately 80% in the direction normal to impact) in the particles. This deformation results in a large increase in particle surface area (approximately 400%). Where a metal coating is applied to a metal substrate, an oxidizing operation must be carried out to convert metal to metal oxide.

The suitability of kinetic metallization for applying a metal coating or metal oxide coating to the surface of a substrate depends on the surface properties of the substrate and whether the metal or metal oxide embeds in the surface or abrades the surface.

Other techniques which can be utilized to deposit a metal oxide coating on a substrate surface include reactive evaporation and plasma assisted chemical vapor deposition.

Evaporation of the coating material is achieved by heating the material such that its vapor pressure exceeds about $10^{-2}$ mbar. Evaporation temperatures vary according to coating material, and can range from about 1300° C. to about 1800° C. or even up to about 3500° C. for refractory metal oxides; in such a case, the chamber pressure can range from about $10^{-4}$ to about $10^{-6}$ mbar. Preferably, the substrate is held about 30–40 cm above the source. Any suitable heating method can be utilized, e.g., resistive, inductive, electron beam impingement, etc., heating.

Compound coatings can be made either by direct evaporation from that compound e.g., copper oxide, or by reactive evaporation, e.g. copper evaporated into a partial pressure of oxygen to give copper oxide. Variations in the process exist either to promote reactions or adhesion, e.g., Activated Reactive Evaporation (ARE) can be used to increase the reaction between the evaporant and the reactive gas.

Another technique, plasma assisted chemical vapor deposition (PACVD), can also be utilized to coat a substrate surface. The substrate to be coated is immersed in a low pressure plasma of the appropriate gases/volatile compounds. The pressure, which can be from about 0.1 to about 10 Torr, can be maintained by balancing the total gas flow-rate against the throughput of the pumping system. The plasma can be electrically activated and sustained by coupling the energy from a power generator through a matching network into the gas medium. Thin films have been successfully deposited from direct current and higher frequency plasmas well into the microwave range. At high frequencies, the energy can be capacitatively or inductively coupled depending on chamber design and electrode configuration. The substrate, which can be set at a temperature of up to about 400° C., can be grounded, floating or subjected to a dc voltage bias as required. Typical deposition rates for this technique can be favorably compared with those obtained by sputtering. The deposition of a copper oxide coating can be achieved by immersing a substrate in a plasma containing copper and oxygen under appropriate processing conditions.

In another embodiment, a metal coating can be applied to a substrate by electroplating followed by an oxidation step to convert metal in the coating to metal oxide. Electroplating is a known technique which uses electrolysis to remove metal molecules, such as copper, from an anode and deposit them on a substrate acting as a cathode thereby coating the cathode.

Electroplating is performed by immersing a conductive surface in a solution containing ions of the metal to be deposited. The surface is electrically connected to an external power supply, and current is passed through the surface into the solution. Where the metal being applied is copper, the reaction $Cu^{2+}+2e^{-}\rightarrow Cu$ occurs at the cathode, or substrate surface, which is coated with copper. In the absence of any secondary reaction, the current delivered to a conductive surface during electroplating is directly proportional to the quantity of metal deposited (Faraday's law of electrolysis). Using this relationship, the mass deposited can be readily controlled through variations of plating current and time.

Electroplating can be carried out using a constant current, a constant voltage, or variable waveforms of current or voltage. Using a constant current, accurate control of the mass of deposited metal is most easily obtained. Plating at a constant voltage and using variable waveforms requires more complex equipment and control but can be useful in tailoring specific thickness distributions and film properties.

Where the substrate has been coated with a metal coating or a mixed metal/metal oxide coating, oxidizing the coating of metal is undertaken to convert same to the corresponding oxide utilizing known treatments including the application of oxidizers such as hydrogen peroxide, persulfates, nitric acid, etc. The oxidizer can be applied by spraying, dipping, etc. and can include corrosion inhibitors such as benzotriazole and anionic or nonionic surfactants. During the oxidizing operation, the temperature should generally be at least about 50° C. The oxidizing solution should be in contact with the metal coating for a period of time ranging from about 2 to about 10 minutes, preferably from about 5 to about 7 minutes. Optionally, the metal coating is cleaned and subjected to a pH-adjusting pretreatment prior to the oxidizing step. The pH-adjusting pretreatment preferably employs a pH ranging from about 5 to about 12, more preferably from about 7 to about 10. Corrosion inhibitors such as benzotriazole can optionally be utilized.

Alternatively, the metal oxide coating can be formed by a plasma ashing technique in which the substrate is coated with, for example, a copper and is then passed through an oxygen glow discharge plasma whereupon the copper is "ashed" to leave a coating of copper oxide on the substrate.

Once the metal oxide coating of desired thickness has been formed, its surface can optionally be texturized to further improve the adhesion of the subsequently applied solid polymer component. Suitable techniques for texturizing the surface of a metal oxide coating are known in the art and include etching, grit blasting, machining, etc.

The thickness of the metal oxide coating can vary widely, e.g., from less than 0.001 to greater than 0.015 inches, preferably from about 0.001 to about 0.015 inches, more preferably from about 0.001 to about 0.010 inches, and most preferably from about 0.001 to 0.005 inches.

After the application of the metal oxide coating to the substrate surface, a solid polymer component is applied to at least a portion of the surface of the polymer adhesion promoting coating of metal oxide. The solid polymer component can be selected from a wide variety of homopolymers, copolymers, polymer blends, filled polymers, and the like. Suitable solid polymers include, but are not limited to, polyolefins, particularly polyethylene and copolymers of ethylene with one or more other olefin monomers. Other useful polymers include, but are not limited to, halogenated polymers, e.g., homopolymers and copolymers of vinyl chloride; polyamides; polyesters; polyimides; polyether ketones, e.g., polyarylether ketones; aromatic polyether imides and sulphones; silicone polymers; alkene/vinyl acetate copolymers; and the like. Preferably, the solid polymer component is a polyolefin. More preferably, polyethylene is used to form the solid polymer component on the substrate.

The solid polymer component can be applied by such well known methods as extrusion, thermal spraying, molding, injection molding, solution coating, etc. Optionally, one or more additives such as colors, fillers, reinforcing agents, stabilizers, plasticizers, etc. can be added to the polymer in the customary amounts to improve the mechanical characteristics of the solid polymer component and/or provide other useful properties.

In one embodiment, the solid polymer component can be applied as a protective inner sleeve to a pipeline or other conduit. Prior art coatings for pipelines may be prone to the formation of blisters, bubbles, and separation from the underlying surface due to the poor adherence of the polymer to the interior surface of the pipe. In accordance with the present invention, the polymer adhesion promoting coating of metal oxide significantly improves the adhesion between the polymer and the substrate surface thus resisting formation and growth of blisters, bubbles, etc., and reduces stress concentrations at pipe section ends, joints, etc. by transferring thermal and flow loads between the polymer and the pipe substrate.

Likewise, the methods of the present invention can be used to coat the external surfaces of pipe lines and conduits. The chemical resistance and impervious characteristics of the polymer can be used to protect metal pipes from external damage when used in highly corrosive environments. Some particularly useful applications include use in oil refineries and chemical plants, particularly those using highly acidic and alkaline chemicals.

Applying a suitable metal oxide coating to a substrate material that enhances adhesion of a polymer, such as polyethylene, may also be utilized to enhance the mechanical properties of the substrate and permit manufacturers to combine the polymer with other substrates.

Other embodiments of the present invention are directed to solid polymer components possessing substrates that will improve strength and durability of many structural components. Thus, not only may an article such as a wire or pipe be coated in accordance with the methods of the present invention, but a substrate, which has a metal oxide in adherent contact with at least a portion thereof, may also be embedded in the solid polymer component, thus providing enhanced mechanical properties to the solid polymer component. For example, high-strength reinforcing bands, belts, and brackets may be embedded in a solid polymer component to enhance its strength while better transferring stresses, reducing stress cracking near the reinforcing elements, and allowing the solid polymer component to fully protect the reinforcing material from chemical corrosion. The adherence of the reinforcing element to the solid polymer component by the polymer adhesion promoting coating of metal oxide therebetween increases capacity of molded intermediate and large bulk containers used for storage, shipping, and machinery of materials such as farm herbicides, insecticides, and fertilizers.

In another embodiment, an awning made of a polymer such as polyethylene may benefit from metal stiffeners. With little or no adhesion between the polymer and stiffener, stresses would not be transferred well, and the polymer would tend to crack at high stress concentration points. Improving the adhesion between the polymer and stiffeners by the polymer adhesion promoting coating of metal oxide therebetween reduces these stresses and increases the life, durability, and load carrying capacity of such an awning.

The method of the present invention can also be used to form solid polymer components for outdoor, underground and underwater communication cables. While prior art cables possess a polymer jacket formed by a mechanical seal, the techniques of the present invention permit overmolding of cable terminations with compatible solid polymer components that form an environmentally resistant bond between the over-mold polymer and the polymer adhesion promoting coating of metal oxide which, in turn, is adhered to the metallic or non-metallic termination cable termination.

It will be understood that various modifications may be made to the embodiments disclosed herein. Therefore, the above description should not be construed as limiting, but merely as exemplifications of preferred embodiments. For example, any substrate which has poor adherence to a solid polymer component may have a metal oxide coating applied thereto which, in turn, may then be adhered to the solid polymer component. In addition, as noted herein, a metal or plastic may be treated with a metal oxide coating and then embedded within a solid polymer component and similarly possess enhanced adherence to the solid polymer component. Those skilled in the art will envision other modifications within the scope and spirit of the claims appended hereto.

What is claimed is:

1. An article which comprises:
    a) a substrate comprising one of magnesium, tantalum and titanium;
    b) a polymer adhesion promoting coating of an oxide copper-containing alloy in adherent contact with at least a portion of a surface of the substrate, wherein the copper-containing alloy is copper in combination with one of arsenic, beryllium, cadmium, phosphorous, tellurium or zirconium; and,
    c) a solid polymer component in adherent contact with at least a portion of the surface of the polymer adhesion promoting coating of the oxide.

2. The article of claim 1 wherein the polymer adhesion promoting coating has a thickness of between about 0.001 and 0.015 inches.

3. The article of claim 1 wherein the solid polymer component is selected from the group consisting of polyolefin, halogenated polymer, polyamide, polyester, polyimide, polyether ketone, aromatic polyether imide, silicone polymer and alkene/vinyl acetate copolymer.

4. The article of claim 3 wherein the polyolefin is a homopolymer of ethylene or a copolymer of ethylene and at least one other olefin monomer.

5. An article which comprises:
    (a) a substrate comprising one of concrete and asphalt;
    (b) a polymer adhesion promoting coating of metal oxide comprising (one of an oxide of copper and) an oxide of a copper-containing alloy in adherent contact with at least a portion of a surface of the substrate, wherein the copper-containing alloy is copper in combination with one of arsenic, beryllium, cadmium, cobalt, chromium, iron, lead, nickel, phosphorous, silicon, silver, tellurium, tin, zinc or zirconium; and,
    (c) a solid polymer component in adherent contact with at least a portion of the surface of the polymer adhesion promoting coating of metal oxide.

6. The article of claim 5 wherein the copper-containing alloy is copper in combination with one of arsenic, beryllium, cadminum, chromium, phosphorous, tellurium and zirconium.

7. The article of claim 5 wherein the polymer adhesion promoting coating of metal oxide has a thickness of less than 0.001 to greater than 0.015 inches.

8. The article of claim 5 wherein the solid polymer component is selected from the group consisting of polyolefin, halogenated polymer, polyamide, polyester, polyimide, polyether ketone, aromatic polyether imide, silicone polymer and alkene/vinyl acetate copolymer.

* * * * *

UNITED STATES PATENT AND TRADEMARK OFFICE
CERTIFICATE OF CORRECTION

PATENT NO. : 6,841,263 B2
DATED : January 11, 2005
INVENTOR(S) : Anderson et al.

It is certified that error appears in the above-identified patent and that said Letters Patent is hereby corrected as shown below:

<u>Title page,</u>
Item [75], Inventor, delete "Czages" and insert therefor -- Czagas --

<u>Column 10,</u>
Line 4, delete "(" and ")"

Signed and Sealed this

Twelfth Day of July, 2005

JON W. DUDAS
*Director of the United States Patent and Trademark Office*